United States Patent [19]

Vora

[11] Patent Number: 5,719,450

[45] Date of Patent: Feb. 17, 1998

[54] TOUCH RESPONSIVE ELECTRIC POWER CONTROLLER

[76] Inventor: Pramod Vora, 27906 Golden Ridge La., San Juan Capistrano, Calif. 92675

[21] Appl. No.: 323,639

[22] Filed: Oct. 17, 1994

[51] Int. Cl.⁶ .................................................. H01H 35/00
[52] U.S. Cl. ................ 307/116; 307/125; 315/362; 361/181
[58] Field of Search .................. 307/112, 113, 307/115, 116, 125; 315/DIG. 4, 361, 362, 291, 74, 129, 294; 340/573, 562; 361/179, 181

[56] References Cited

U.S. PATENT DOCUMENTS

| 4,031,431 | 6/1977 | Gross ........................... 307/326 |
| 4,584,519 | 4/1986 | Groudis ........................ 323/245 |
| 5,191,265 | 3/1993 | D'Aleo et al. ................. 315/295 |
| 5,399,940 | 3/1995 | Hanna et al. ................. 315/129 |
| 5,489,891 | 2/1996 | Diong et al. ................. 340/567 |
| 5,559,375 | 9/1996 | Jo et al. ....................... 307/10.1 |

*Primary Examiner*—William M. Shoop, Jr.
*Assistant Examiner*—Jonathan S. Kaplan
*Attorney, Agent, or Firm*—Roy A. Ekstrand

[57] ABSTRACT

An electrical power controller includes an input filter, a touch logic and a power conditioner combining to control a power device coupled to an electrical load which in turn is coupled to an AC main power source. The controller includes an overload or short circuit current sensor and apparatus for disabling the electrical power coupling to the load to protect both the load and the output power device against excessive current. A visual display indicating the level of voltage applied to the load is provided. In alternate embodiments, a timer having a preprogrammed power variation profiles imposes a predetermined variation of power to the load over time.

14 Claims, 8 Drawing Sheets

TOUCH RESPONSIVE ELECTRIC POWER CONTROLLER

FIELD OF THE INVENTION

This invention relates generally to electrical power controls and particularly to those responsive to manual touch.

BACKGROUND OF THE INVENTION

A number of touch responsive electric power devices for controlling lamps or other similar electrical loads have been developed through the years. While the structures of such controllers has varied substantially, most include a touch sensor responsive to the capacitance of a touching hand or finger which is sensed and used to control a power device. The power device in turn is used to couple the main power source such as a conventional AC power connection to the load.

One problem which has arisen in utilizing such touch responsive controllers is their general lack of ability to cope with short circuit or overload conditions. In particular, the power control device is extremely vulnerable to the high current demands presented by such short circuits or overloads. One of the most common sources of overload or short circuit conditions arises when the filament within an incandescent lamp is severed producing filament portions which fall downwardly upon the filament support wires and produce a low resistant short circuit therebetween.

Another problem facing such touch responsive controllers is their general inability to function when coupled to electrical loads having substantial inductance or capacitance rather than a largely resistive load such as an incandescent lightbulb. The high surge currents characteristic of inductive or capacitive loads frequently damage such touch controllers.

For example, U.S. Pat. No. 4,939,382 issued to Gruodis sets forth a TOUCH RESPONSIVE POWER CONTROL SYSTEM in which the majority of signal processing functions are achieved through digital circuitry including a controllable pulse generator responsive to the change in capacitance caused by a human touch upon a sensitive control point of the device. The magnitude of capacitance changed caused by the human touch is encoded in the form of the number of pulses contained in a pulse train during a selected time period. The pulses are counted and digitally compared to a stored count to produce an error signal for controlling the power level.

U.S. Pat. No. 4,731,548 issued to Ingraham sets forth a TOUCH CONTROL SWITCH CIRCUIT utilizing body capacitance sensed by a device coupled to a logic circuit through current limiting resistors. The logic circuit has an output coupled to the gate terminal of a triac which in turn is coupled to an electrical load for applying a predetermined current level.

U.S. Pat. No. 4,701,676 issued to Gibson sets forth a TOUCH CONTROL ADAPTER for connecting in series between a source of electrical power and an electrical appliance. The device isolates the capacitance to ground characteristic of the appliance from the power supply and allows the flow of electrical power to the appliance to be regulated by human touch upon a designated surface.

U.S. Pat. No. 4,668,876 issued to Skarman sets forth a TOUCH CONTROL SWITCH AND LAMP SYSTEM including a touch control dimmer switch adapted to be plugged into a standard electrical household outlet and having a socket for receiving a lamp plug. A touch control wire within the power cord of the lamp connects to a conductive portion of the lamp and to touch control circuitry within the switch so that the lamp may be controlled by touching the conductive portion.

U.S. Pat. No. 4,651,022 issued to Cowley sets forth a DIGITAL TOUCH OPERATED SWITCH for control of an electrical lighting appliance or other equipment requiring non-sparking fail safe operation. The switch utilizes digital complementary metal oxide semiconductor technology which requires relatively low standby power and which prevents extraneous operation from static discharge, radio frequency signals or power line transients.

U.S. Pat. No. 4,584,519 issued to Gruodis sets forth an INCREMENTAL TOUCH OPERATED SWITCH which varies the AC voltage applied to an electrical apparatus in an incremental fashion. The invention includes digital circuitry which compares a control pulse train with a touch affected pulse train to create a switching pulse used to control the power applied.

U.S. Pat. No. 4,250,432 issued to Kohler sets forth a TOUCH DIMMER CIRCUIT incorporating an integrated circuit for controlling a thyristor dimming circuit. The dimmer switch includes a touch control connected in a high impedance unidirectionally conducting circuit together with a filter for removing ambient electrical noise.

U.S. Pat. No. 4,246,494 issued to Foreman, sets forth a DIGITAL TOUCH CONTROLLED DIMMER SWITCH having a control keyboard coupled to a triac type power control device. Digital circuitry within the controller is coupled between the keyboard input and the triac.

U.S. Pat. No. 4,237,386 issued to Instance sets forth a PLUG-IN MODULE FOR TOUCH CONTROL SWITCHING for use with electrical apparatus including a power connection. The plug-in module receives the power connection of the appliance and is further connected to a source of electrical power.

U.S. Pat. No. 4,211,959 issued to Deavenport, et al. sets forth a TOUCH CONTROL ADAPTED FOR ELECTRICAL LAMPS for use with a standard electrical lamp. The control includes a male electrical receptacle of the screw-in type for attachment to a conventional lightbulb socket. The adapter further includes a female electrical receptacle of the screw-in type for receiving the lightbulb. An external touch control surface is provided which controls the power coupling of the adapter to the lightbulb in response to human touch.

U.S. Pat. No. 4,101,805 issued to Stone sets forth a TOUCH RESPONSIVE SOCKET for mounting an electrical device such as an ordinary incandescent lightbulb and enabling the electrical device to be switched between on and off conditions in response to touching the socket housing. All electrical components required to affect this switching of power to the electrical device are mounted within the socket housing.

U.S. Pat. No. 3,715,623 issued to Szabo sets forth a NETWORK FOR VARYING CURRENT THROUGH A LOAD having a sensing device controlling an input pulse generator connected to the input terminal of at least two cascaded bistable devices. The output signals of the bistable devices are decoded and the resulting signals used in a control circuit for controlling the amount of current in a load responsive to the decoder signal.

U.S. Pat. No. 4,163,923 issued to Herbers, et al. sets forth a VARIABLE DUTY CYCLE LAMP CIRCUIT for producing the effect of a three-way lamp bulb using a single filament bulb. The circuit features a touch control increment counter which controls the ramp rise rate of a saw-tooth generator which is synchronized to the alternating current power source. A trigger circuit accepts the saw-tooth waveform to produce triac control pulses of time durations dependent upon the ramp rise rate.

Additional touch controlled electric switches are shown in U.S. Pat. No. 5,208,516 issued to Saidian; U.S. Pat. No. 4,613,790 issued to Roorda; U.S. Pat. No. 4,591,765 issued to Beck; U.S. Pat. No. 4,321,479 issued to Ledniczki, et al.; U.S. Pat. No. 4,289,980 issued to McLaughlin; and U.S. Pat. No. 3,171,066 issued to Atkins, et al.

While the foregoing described prior art devices have provided various types of touch responsive controllers and adapters, they remain subject to a variety of problems and limitations including those described above. Thus, there remains a continuing need in the art for evermore improved, reliable, flexible and easily used touch controllers for electrical apparatus.

SUMMARY OF THE INVENTION

Accordingly, it is a general object of the present invention to provide an improved touch responsive electric power controller. It is a more particular object of the present invention to provide an improved touch responsive electric power controller capable of controlling both resistive, capacitive and inductive electrical loads and motor loads with equal facility. It is a still more particular object of the present invention to provide an improved touch responsive electric power controller which is protected against short circuit and overload conditions. It is a still more particular object of the present invention to provide an improved touch responsive electric power controller which provides a convenient power level indication and which is programmable by the user. It is a further object of the present invention to provide a power controller which is particularly well-suited to fabrication in a circuit pair or single integrated circuit form.

In accordance with the present invention, there is provided for use in controlling AC electrical power applied to a load from an AC main, a controller comprising: a touch logic circuit coupled to the AC main and having a touch input; a power conditioner coupled to the touch logic having a voltage level display and producing a power control signal; a power device coupled to the power conditioner and the load varying the voltage applied to the load from the AC main in response to the power control signal; sensing means coupled to the power device for providing a signal indicative of the current in the power device; overload means responsive to the signal from the sensing means for causing the power conditioner to cease producing the power control signal when the signal from the sensing means exceeds a predetermined level; and touch means for altering the touch logic circuit in response to human touch.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENTS

Figure 1:
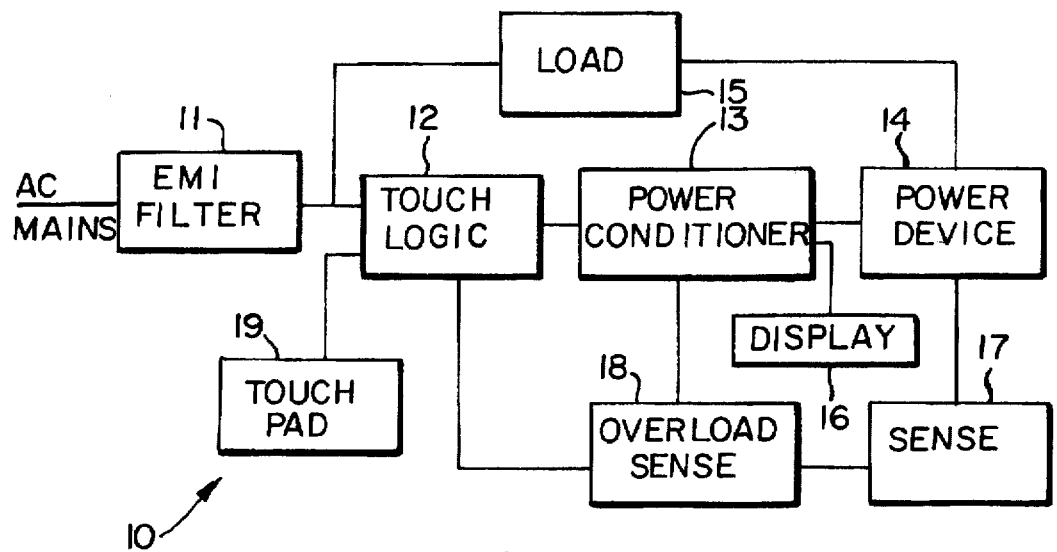
FIG. 1 sets forth a block diagram of a touch responsive electric power controller constructed in accordance with the present invention.

FIG. 1 sets forth a block diagram of a touch responsive electric power controller constructed in accordance with the present invention and generally referenced by numeral 10. It should be noted that while the figures below set forth single switch or single controller circuits, such controllers may be combined in multiple arrays similar to light switch arrays to control multiple loads. Power controller 10 includes an input filter 11 coupled to a conventional AC main power source which in turn is coupled to a touch logic circuit 12. Touch logic circuit 12 is coupled to a touch pad 19 and to a power conditioner 13. The output of power conditioner 13 is coupled to a power control device 14 which in turn is coupled to an electrical load 15. A sensor 17 is coupled to power device 14 and an overload detector 18 is coupled to sensor 17 and power conditioner 13. Overload detector 18 is further coupled to touch logic circuit 12. A display 16 is coupled to an output of power conditioner 13. It should be noted that while the embodiment of the present invention power controller set forth in FIG. 1 is coupled to a conventional AC main power source, the present invention controller is not limited to control of AC main power. On the contrary, the present invention controller may be used for radio frequency (RF) power, multiple phase power systems at a wide range of frequencies, DC power or virtually any electric power source.

In operation, the electrical power provided by the conventional AC mains is filtered by filter 11 to remove electromagnetic interference and is applied to touch logic circuit 12. The output alternating current power of filter 11 is further applied to load 15 which is coupled to power device 14 such that the voltage applied to load 15 is determined in response to the condition of power device 14. While various power devices may be utilized for control device 14, it has been found advantageous to utilize a conventional triac control device. Power conditioner 13 by means set forth below in greater detail controls the operation of power device 14 in response to the input signals provided by touch logic circuit 12. Touch logic circuit 12 in turn includes a capacitance responsive touch pad 19 which is touched by the user to affect circuit changes. Thus, in a typical operation, touch pad 19 is touched by the user to produce a capacitance change which is sensed by touch logic 12 and results in a control signal being applied to power conditioner 13. Conditioner 13 produces a corresponding change in the operation of power device 14 which in turn controls the operation of load 15.

In accordance with an important aspect of the present invention, controller 10 utilizes a load current sensor 17 which responds to currents within power device 14 to produce a signal which is sensed by overload detector 18 in the event of an overload or short circuit being applied to power device 14. Overload sensor 18 by means set forth below in greater detail responds to the output of current sensor 17 to disable power conditioner 14 and terminate the operation of power device 14. Concurrently, overload sensor 18 responds further to reset touch logic 12 to the off condition to maintain the off condition of power device 14.

In accordance with a further advantage of the present invention electric power controller, power conditioner 13 responds to the control signals provided by touch logic 12 to cause display 16 to provide a visual indication of the power level applied by device 14 to load 15. Thus, as load power increases, display 16 reflects increased load power in a visual manner such as a more brightly glowing indicator bulb or similar device. Conversely, as load power is decreased, the visual indication of display 16 changes correspondingly.

Thus, in accordance with the present invention and as is described below in greater detail, the present invention controller is able to respond to electrical overloads and short circuit conditions applied to the vulnerable power device and terminate the application of electrical power to the load thereby preventing damage to both the load and controller output power device. In addition, by means set forth below in greater detail, the present invention controller provides for a "slow start" or gradual power application to the power device and load in response to touch pad inputs. This protects load devices from thermal shock and fatigue. Also, this has been found particularly advantageous for operation of high surge current loads such as capacitive or inductive loads provided by motors, fans, motors with starting capacitors or the like. In addition, other high surge loads such as radio frequency transmitters may advantageously be operated by the present invention controller. The system utilizes a substantially less complex synchronizing system for operation of the triac power device and utilizes an extremely low standby power in the off condition. The present invention device may be fabricated within a manufactured item such as an appliance or utilized as an additional aftermarket plug-in type apparatus for use in combination with a conventional appliance. The present invention may also be used to control fluorescent tube lighting, halogen bulbs or other similar lighting devices.

Because inductive loads such as motors may be controlled by the present invention system, substantial cost savings in motor construction may be achieved. For example, multiple tap motors are no longer needed when using the present invention system.

Figure 2:
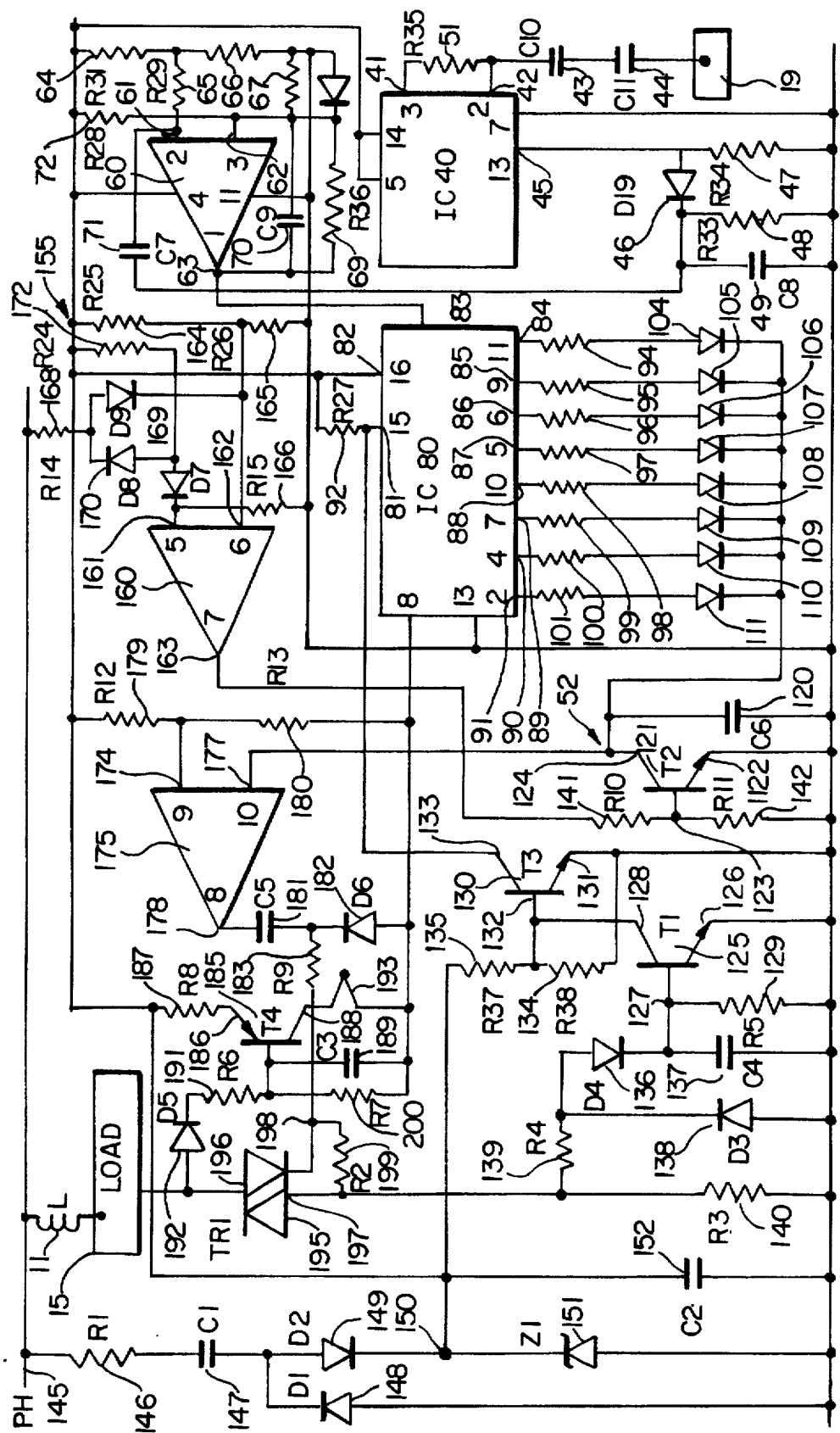
FIG. 2 sets forth a schematic diagram of the present invention touch responsive electric power controller.

FIG. 2 sets forth a schematic diagram of the present invention touch responsive electric power controller generally referenced by numeral 10. It should be noted that while the embodiments of the present invention shown in the following figures use a plurality of integrated circuits, the invention may be fabricated as a single custom integrated circuit for a more compact and cost effective embodiment. Power controller 10 includes an integrated circuit 40 having a device type CD4047 configured to provide an astable multivibrator having inputs 41 and 42 commonly coupled by a resistor 51 and further coupled to a pair of series capacitors 43 and 44. A touch pad 19 is coupled to capacitor 44. Integrated circuit 40 further includes conventional couplings to operating supply voltage and to ground as well as an output terminal 45. For convenience, the conventional pin numbers for integrated circuit 40 are also shown in FIG. 2. Output terminal 45 of integrated circuit 40 is coupled to ground by a resistor 47 and is further coupled to a parallel resistor 48 and capacitor 49 by a diode 46. The junction of diode 46, resistor 48 and capacitor 49 forms a node 50. Controller 10 further includes an integrated circuit 80 having a general device number CD4017 which comprises a decade counter/divider and which includes an input terminal 83 and a plurality of output terminals 84 through 91. Terminals 84 through 91 are each coupled to a plurality of diodes 104 through 111 respectively by a plurality of series resistors 94 through 101 respectively. The cathodes of diodes 104 through 111 are commonly coupled to a node 52. Integrated circuit 80 further includes a supply terminal 82 coupled to a source of operating supply voltage and a recess terminal 81.

Controller 10 further includes an operational amplifier 60 having a pair of input terminals 61 and 62 and an output terminal 63. Input 61 is coupled to node 50 by a capacitor 71. Input 61 is further coupled to a voltage divider formed by resistors 64 and 66 by a resistor 65. Input 62 is coupled to ground by a resistor 67 and is further coupled to operating supply by a resistor 72. A diode 68 is coupled in parallel with resistor 67 and a resistor 69 is coupled in parallel with capacitor 70. Output terminal 63 of operational amplifier 60 is coupled to input 83 of integrated circuit 80. An NPN transistor 121 includes an emitter 122 coupled to ground, a base 123 coupled to ground by a resistor 142, and a collector 124 coupled to node 52. A capacitor 120 is coupled between node 52 and ground. An operational amplifier 160 includes a pair of inputs 161 and 162 and an output 163. Output 163 is coupled to base 123 of transistor 121 by a resistor 141. Input 162 is coupled to the junction of a pair of voltage divider resistors 164 and 165. A resistor 168 is coupled to AC power input 145 and to a pair of oppositely oriented diodes 169 and 170. The cathode of diode 169 is coupled to input 162 while the anode of diode 170 is coupled to the anode of diode 171 and the common junction is coupled to a source of operating supply voltage 155 and by a resistor 172. An operational amplifier 175 includes an input 176 coupled to the junction of a pair of voltage divider resistors 179 and 180, an input 177 coupled to node 52, and an output 178. Output 178 is coupled to ground by the series combination of a capacitor 181 and a diode 182. A PNP transistor 185 includes an emitter 186 coupled to supply voltage node 155 by a resistor 184, a base 187 coupled to ground by the parallel combination of a capacitor 189 and a resistor 190 and a collector 188 coupled to ground by a light emitting diode 193. Base 187 of transistor 185 is further coupled to a load 15 by the series combination of a resistor 191 and a diode 192. A filter inductor 11 couples load 15 to main supply input 145.

A triac 195 includes a terminal 196 coupled to load 15 and a terminal 197 coupled to ground by a sensing resistor 140. Triac 195 further includes a trigger electrode 198 coupled to the junction of capacitor 181 and diode 182 by a resistor 183. A regulated power supply includes a zener diode 151 coupled to a junction 150 and having a capacitor 152 in parallel therewith. Junction 150 is coupled to a rectifying diode 149 which in turn is commonly coupled to the main supply terminal 145 by the series combination of a capacitor 147 and a resistor 146. Diode 148 is in parallel with the series combination of diode 149 and zener 151. The supply voltage produced at junction 150 is maintained at a constant operating supply voltage by the zener breakdown action of zener diode 151 and the action of filter capacitor 152. This voltage is provided to the remainder of the touch controller circuit and is referenced as operating supply terminal 155.

Power controller 10 further includes a resistor 139 coupled to terminal 197 of triac 195 and a pair of oppositely oriented diodes 136 and 138. Diode 138 is coupled to ground while diode 136 is coupled to base 127 of a transistor 125. A parallel resistor 129 and capacitor 137 couple base 127 to ground. Transistor 125 is an NPN transistor having an emitter 126 grounded and a collector 128. An NPN transistor 130 includes an emitter 131 coupled to ground, a base 132 coupled to collector 128 and a collector 133 coupled to reset terminal 81 of integrated circuit 80. A pair of voltage divider resistors 135 and 134 are coupled to base 132 of transistor 130.

In operation, integrated circuit 40 is configured to form a free running or astable multivibrator having a frequency of oscillation determined by the distributed capacitance existing between input terminal 42 and ground together with the resistance of resistor 51. In accordance with the preferred node of the present invention controller, integrated circuit 40 is oscillating at a frequency close to its maximum frequency capability and thus produces an output waveform which approximates a triangular waveform signal at output terminal 45. The combination of diode 46, resistors 47 and 48 and capacitor 49 form a DC converting or peak detecting circuit which converts the applied triangular output waveform of the multivibrator to a DC voltage at node 50 which corresponds in voltage to the amplitude of signal produced by integrated circuit 40. This DC voltage is applied to input 61 of operational amplifier 60 by a capacitor 71. Input 61 is biased by a voltage divider formed by resistors 64 and 66. The remaining input 62 of operational amplifier 60 is also maintained at a fixed voltage by resistors 72 and 67. Thus, under normal operating conditions, the DC voltage supplied by detecting the output waveform of integrated circuit 40 charges capacitor 71 and maintains the charge thereon thereby causing operational amplifier 60 to maintain a low voltage output condition at output 63.

When the user touches touch pad 19, however, the additional loading upon terminal 42 of integrated circuit 40 serves to dampen the oscillation of the multivibrator reducing the amplitude of its output at terminal 45. This reduction of output signal amplitude is detected by the DC converter or peak detector which in turn produces a reduced voltage at node 50. The drop in voltage at node 50 causes capacitor 71 to discharge temporarily producing a reduced voltage at terminal 61 of operational amplifier 60 causing its output at terminal 63 to go high. The output signal of amplifier 60 produced each time touch pad 19 is touched by the user is coupled to input 83 of integrated circuit 80.

Integrated circuit 80 is configured to form a decade counter in which the output count is applied to outputs 84 through 91. Thus, integrated circuit 80 counts each applied pulse produced by operational amplifier 60 in response to user touching of touch pad 19 and produces output signals at outputs 84 through 91 correspondingly. Thus, the first time user touches pad 19, a single output pulse is produced by operational amplifier 60 which in turn causes output 84 of integrated circuit 80 to go high or assume a "logic one state". This logic state is maintained until the next time the user touches pad 19 producing another output pulse from operational amplifier 60 which then causes output 85 to go high and output 84 to go low and so on. Integrated circuit 80 includes a reset terminal 81 which as described below provides a reset or clearing action of output 84 through 91 each time a reset pulse is applied thereto. Putting aside the operation of reset of the counter, the number of touch pad touches (for example four) by the user is reflected in the fourth output of integrated circuit 80 being maintained at a high logic state. Each of outputs 84 through 91 are commonly coupled to a charging capacitor through a series resistor and diode combination. The diodes serve to isolate the individual outputs and the current from each output terminal is applied to capacitor 120 causing it to charge at a rate determined by the resistor in the particular output provided in integrated circuit 80. Thus, if a single output terminal is high in response to a single user touch of pad 19, the lowest charging current is applied to capacitor 120. Conversely, when the user touches pad 19 a second time, the second output of integrated circuit 80 is placed at a high voltage condition increasing the current applied to charge capacitor 120 because of the reduced resistance in that output. Similarly, a third touch produces further increasing of the charging current and so on.

In the preferred form of the present invention controller, the outputs of integrated circuit 80 are divided into groups of four with interposed off condition outputs between each group of four. As a result, a four level switch is achieved having operating states corresponding to off, night light, low, medium and high in a repeated ascending sequence. It will be apparent to those skilled in the art, however, that different grouping of outputs may be utilized to provide different switch levels and level characteristics.

Operational amplifier 160 is coupled to the AC main supply by diodes 169 and 170 together with resistor 168. The function of diodes 169 and 170 is to apply each positive and negative half cycle of the AC main supply waveform to inputs 162 and 161 respectively. Because the inputs of operational amplifier 160 are biased near the operating supply voltage, the normal output state of operational amplifier 160 in the absence of applied AC signal maintains a high signal output condition at output 163. Each positive and negative going portion of the applied AC waveform however upsets this balance during the entire AC waveform cycle and drives the output of operational amplifier 160 to a low voltage state for all portions of the AC waveform except the zero crossing instances. Thus, the output of operational amplifier 160 goes high during the zero crossing intervals of the applied AC main waveform.

Figure 3:
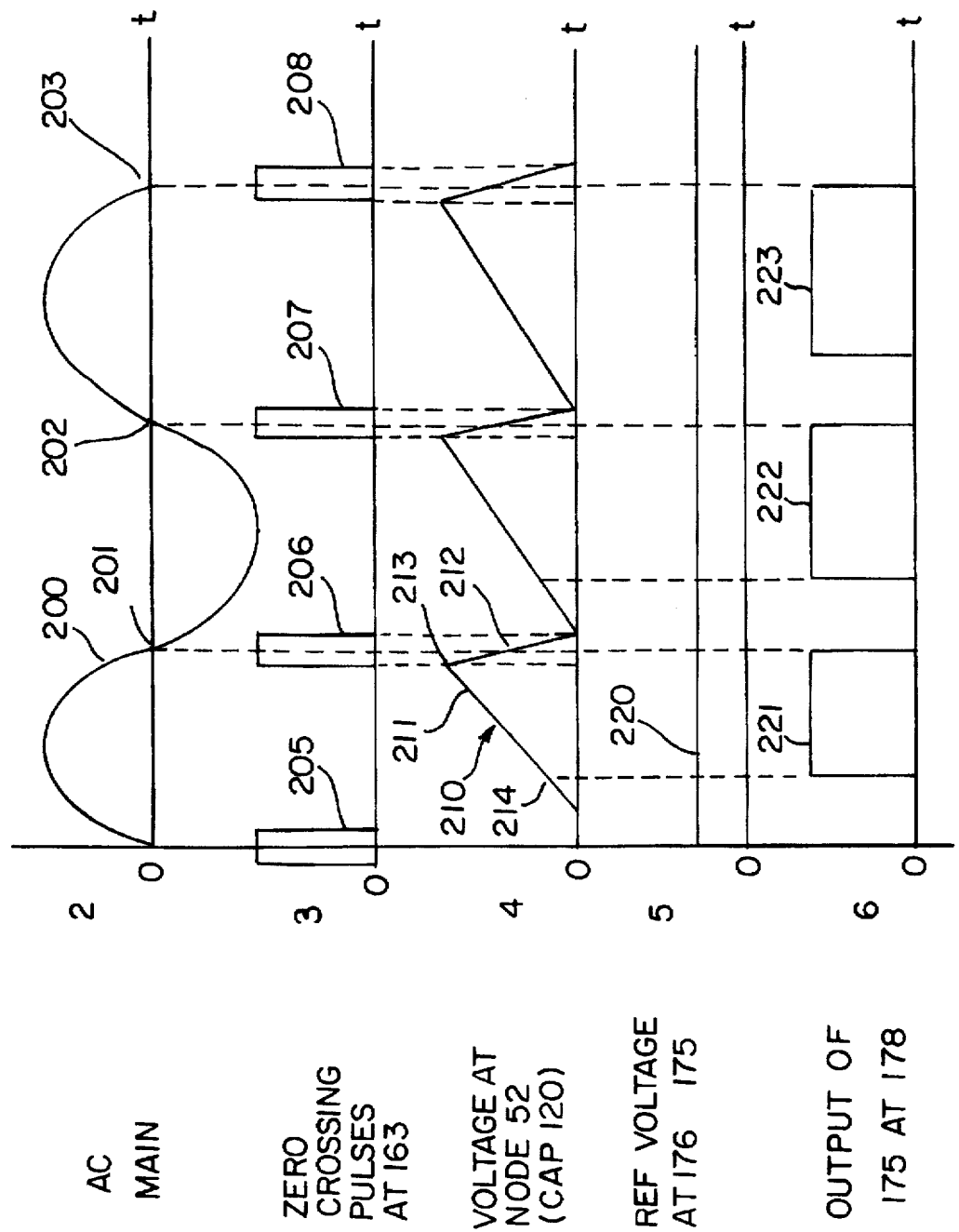
FIG. 3 sets forth illustrative signal waveforms associated with the present invention touch responsive electric power controller.

With temporary reference to FIG. 3, the sinusoidal waveform reference by numeral 200 is shown which corresponds to the AC main signal. Thus, it should be noted that AC waveform 200 defines zero crossing intervals 201, 202, 203 and so on each time the signal crosses through the main zero voltage axis. Correspondingly, the output pulses produced by operational amplifier 160 during these zero crossing intervals are also shown in FIG. 3 as pulses 205, 206, 207 and 208. It should be noted that output signals are produced at each zero crossing of the main AC waveform regardless of the direction of transition.

Returning to FIG. 2, the output zero crossing signal of operational amplifier 160 is applied to base 123 of transistor 121 causing it to conduct during the zero crossing interval and thereby rapidly discharge capacitor 120. With reference to FIG. 3, waveform 210 shows the resulting voltage at node 52 as capacitor 120 is charged and discharged producing waveform 210. Thus, waveform 210 includes a relatively long charging interval of increasing voltage 211 followed by a rapid decreasing voltage discharge interval 212. It should be recalled that the rate of charge of capacitor 120 and hence the slope of charging portion 211 in waveform 210 is determined by the number of touches on the touch plate.

The resulting sawwave voltage at capacitor 120 is applied to one input of operational amplifier 175 which has the remaining output biased to a fixed voltage shown as voltage level 220 in FIG. 3. Operational amplifier 175 produces a high output voltage condition at output 178 each time the applied sawwave signal at input 177 exceeds the reference voltage at input 176. Once again with reference to FIG. 3, the output waveform of operational amplifier 175 is shown forming a series of positive going pulses 221, 222 and 223. As can be seen, the output of operational amplifier 175 goes high when the sawwave voltage at input 177 exceeds reference level 220. For example, in FIG. 3, operating point 214 is shown on waveform 210 to indicate the point at which waveform 210 exceeds reference voltage 220.

The output waveform of operational amplifier 175 is coupled by capacitor 181 and resistor 183 to trigger input 198 of triac 195. Thus, each time the output of operational amplifier 175 goes high, triac 195 is fired causing it to conduct and causing current to flow through load 15. Diode 182 prevents triac 195 from firing during the time interval when capacitor 120 is being discharged due to transistor 121 conduction. In accordance with the conventional operation of triac 195, the amount of power applied to load 15 is controlled by controlling the relative timing between the main AC power waveform and the firing of the triac. Thus, firing the triac earlier in the AC power cycle increases the output voltage applied to load 15 while conversely firing the triac later in the cycle will decrease the voltage applied. It should be recalled that the firing of triac 195 coincides with the output signal produced by operational amplifier 175 which in turn is determined by the slope or rate of charging of capacitor 120. Thus, as capacitor 120 is charged at a higher rate, the output of operational amplifier 175 is shifted earlier in time causing increased voltage applied to load 15 while slower charging of capacitor 120 shifts the firing of triac 195 later in the cycle reducing the voltage. It should be recalled that the charging rate of capacitor 120 is determined by the number of touches on the touch plate.

Thus, as the user touches pad 19, the output states of integrated circuit 80 are changed causing the charging rate of capacitor 120 to be changed and shifting the firing of triac 195. As a result, the voltage applied to triac 195 is controlled directly by the number of touches applied to touch pad 19. Because the present invention system changes power applied to the load in a slower manner, the abrupt thermal shock to the load is minimized. Thermal shock caused by abrupt power changes has been found to fatigue elements and conductors within electric power devices causing early failure. Incandescent lamps, toasters and other resistance heating devices are particularly sensitive to such thermal shock.

The current flowing through load 15 and triac 195 also flows through resistor 140 which provides a load current sensor for controller 10. The voltage developed across resistor 140 corresponds directly to the current carried by load 15. Diodes 136 and 138 together with capacitor 137 and resistor 139 convert the voltage across resistor 140 to a DC voltage having an amplitude corresponding to the current through resistor 140. This DC voltage is applied to the base of transistor 125 which is normally nonconducting due to the coupling of resistor 129 to ground. However, once the voltage developed across resistor 140 exceeds a predetermined amplitude, the resulting DC voltage at base 127 causes transistor 125 to be turned on. Because transistor 125 is coupled to base 132 of transistor 130 which is a normally conducting transistor stage, the conduction of transistor 125 caused by excessive voltage across resistor 140 turns transistor 130 off producing an increase in voltage at collector 133. The rising voltage at collector 133 is applied to reset terminal 81 of integrated circuit 80 clearing the counter of integrated circuit 80 and placing all outputs at zero or low voltage states. The configuration of the output of integrated circuit 80 at low voltage states terminates the charging of capacitor 120 and prevents the firing of triac 195. As a result, the system is protected against short circuit or overload conditions which cause prohibitively high current to flow through load 15, triac 195 and resistor 140. Such high currents trigger transistor 125 turning off transistor 130 and resetting the counter of integrated circuit 80 thereby terminating the trigger of triac 195. In the absence of trigger pulses, triac 195 remains nonconducting and the load current is terminated once the present half cycle of applied AC main power has been completed. As a result, the present invention system need only withstand the short circuit or overload current condition during a half cycle or less of the AC power waveform. As a result, overload protection permits the use of a lower power triac device which in turn allows further miniaturization of the system and its fabrication in integrated circuit form. This in turn makes the system more cost effective. In addition, the safety of system operation is enhanced since overload failures may otherwise cause injury or create a fire hazard as an unprotected system fails.

Diode 192, resistors 191 and 190, and capacitor 189 produce a DC voltage proportional to the AC voltage across triac 195. This DC voltage is applied to base 187 to control the conduction of transistor 185. Transistor 185 is a PNP transistor having a light emitting diode 193 in its collector circuit and its emitter coupled to supply. Thus, the conduction level of transistor 185 produces a corresponding illumination level of light emitting diode 193. Because the voltage across triac 195 varies inversely with the voltage applied to load 15, an increase of voltage across triac 195 corresponds to a decreased voltage across load 15. Conversely, a decreased voltage across triac 195 corresponds to an increased voltage across load 15. Accordingly, as the voltage across triac 195 increases, the DC voltage at base 187 of transistor 185 reduces the conduction of transistor 185 causing a reduced light output of light emitting diode 193. Conversely, as the voltage across triac 195 decreases, the conduction level of transistor 185 is increased causing an increase illumination of light emitting diode 193. As a result, the illumination produced by light emitting diode 193 varies directly with the voltage applied to load 15. Thus, light emitting diode 193 provides a visual indication of the voltage level applied to load 15 and may be used by the operator to determine the operating condition of the present invention power controller from locations remote from the actual load itself. This provides substantial improvement over prior art systems which utilize an indicator which must of necessity be located near the operating load. It will be apparent to those skilled in the art that other types of power level indicating devices may be used as alternatives to a light emitting diode without departing from the spirit and scope of the present invention. For example, an array of light elements, such as light emitting diodes may be used. Further, a meter or numeric display or other equivalents may be used.

Figure 4:
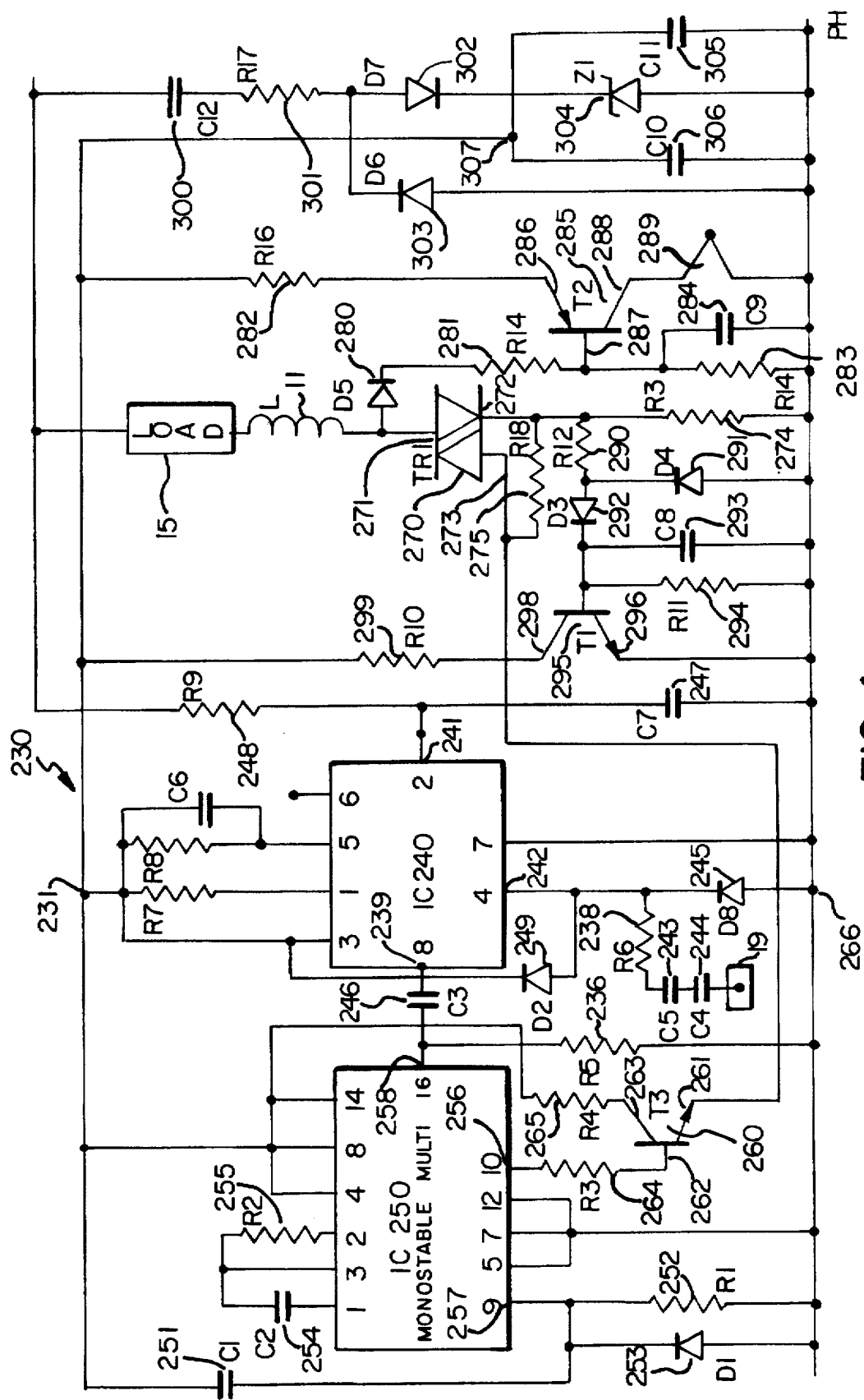
FIG. 4 sets forth a schematic diagram of an alternate embodiment of the present invention touch responsive electric power controller.

FIG. 4 sets forth a schematic diagram of an alternate embodiment of the present invention power controller generally referenced by numeral 230. Controller 230 includes an integrated circuit 240 which comprises a standard integrated circuit having device number LS7538 manufactured by LSI Computer Systems, Inc. For purposes of understanding, the individual pin numbers of integrated circuit 240 are shown in FIG. 4. In addition, however, reference numbers relating to the discussions which follow are also utilized. Integrated circuit 240 comprises a circuit known generally as a touch control step dimmer light switch with automatic gain control. Integrated circuit 240 is commonly provided to the marketplace for use in controlling a power load such as a plurality of incandescent lightbulbs employing a triac control device. The integrated circuit 240 includes a touch input 242. Input 242 is coupled to the series combination of a resistor 238 and a pair of capacitors 243 and 244 which in turn are coupled to touch pad 19. A pair of diodes 245 and 249 are further coupled to input 242 to protect integrated circuit 240 against power spikes occurring within the operating power system. Integrated circuit 240 receives an input sample of the AC power waveform at input 241 and produces a triac triggering signal at output 239. In accordance with the fabrication of integrated circuit 240 using the above-mentioned LS7538 conventional integrated circuit, the relative timing of the output trigger pulse at output 239 to the sampled AC power waveform is controlled in response to user inputs at touch pad 19.

While the LS7538 integrated circuit used for integrated circuit 240 in controller 230 is adequate for controlling resistive loads such as incandescent lamps or the like, it is not capable of handling inductive loads such as fans, motors or the like as contemplated by the present invention controller. Accordingly and in accordance with the present invention, controller 230 further includes an integrated circuit 250 configured to provide a monostable multivibrator which receives the trigger pulse provided by integrated circuit 240 and converts it to a more suitable trigger signal for operating the controlling triac of controller 230. More specifically, integrated circuit 250 is preferably fabricated using a device having the device number CD4047A or its equivalent. Thus, with integrated circuit 250 configured as a monostable multivibrator, capacitor 254 and resistor 255 provide the RC time constant for the resulting multivibrator which determines the pulse width produced.

Integrated circuit 250 further includes an input 258 coupled to output 239 of integrated circuit 240 by a capacitor 246 and coupled to ground by a resistor 236. Integrated circuit 250 further includes a reset input 257 coupled to ground by a resistor 252 and a parallel diode 253. A capacitor 251 couples reset input 257 to operating supply terminal 231. Integrated circuit 250 further includes an output terminal 256. An NPN transistor 260 includes an emitter 261, a base 262 coupled to output 256 by a resistor 264, and a collector 263 coupled to operating supply 231 by a resistor 265.

A load 15, a filter coil 11, and a triac 270 together with a current sensing resistor 274 are series coupled across the AC supply in the manner described above in FIG. 2. Triac 270 includes a terminal 271 coupled to filter 11, a terminal 272 coupled to sensing resistor 274 and a trigger input 273 coupled to emitter 261 of transistor 260. A resistor 275 is coupled between trigger input 273 and terminal 272. In the same manner described above in FIG. 2, triac 270 is operative to control the voltage applied to load 15 in accordance with the relative timing of trigger pulses applied to trigger input 273.

Controller 230 further includes an NPN transistor 295 having an emitter 296 coupled to ground, a base 297 coupled to ground by the parallel combination of a resistor 294 and a capacitor 293, and a collector 298 coupled to operating supply 231 by a resistor 299. A resistor 290 couples the junction of triac 270 and resistor 274 to a pair of oppositely oriented diodes 291 and 292. The latter is coupled to base 297 of transistor 295. The combination of transistor 295 and the voltage detector formed by resistors 290 and 294 together with capacitor 293 and diodes 291 and 292 form a short circuit or overload detector which corresponds to the short circuit and overload protector shown in FIG. 2 above and described therein.

By way of further similarity to the circuit shown in FIG. 2, controller 230 further includes a diode 280 and a resistor 281 series coupled to a base 287 of a PNP transistor 285. Base 287 is further coupled to ground by the parallel combination of a resistor 283 and a capacitor 284. Transistor 285 includes an emitter 286 coupled to operating supply 231 by a resistor 282 and a collector 288 coupled to ground through a light emitting diode 289. Transistor 285 together with diode 280, resistors 281 and 283 and capacitor 284 cooperate to form a power level indicator in which the illumination of light emitting diode 289 responds inversely to the voltage across triac 270 to provide an illumination of light emitting diode 289 which corresponds directly to the voltage applied to load 15 in the manner described above in FIG. 2.

Controller 230 further includes a regulated power supply formed by a pair of diodes 302 and 303 coupled to the AC power source by a series resistor 301 and capacitor 300. A zener diode 304 and filter capacitors 305 and 306 cooperate to stabilize the regulated supply voltage at node 307.

In operation, integrated circuit 240 responds to the application of manual touch by the user to touch pad 19 to establish a series of trigger pulses at output terminal 239. The output pulses from integrated circuit 240 are differentiated by capacitor 246 and resistor 236 to provide an input trigger pulse to the monostable multivibrator circuit of integrated circuit 250. Integrated circuit 250 responds to produce a uniform output pulse having an extended pulse duration at output 256 in accordance with the time constant provided by resistor 255 and capacitor 254. This longer duration uniform trigger pulse is power amplified by transistor 260 and applied to trigger 273 of triac 270 controlling the conduction of triac 270 and the voltage applied to load 15. The current carried by load 15 and triac 270 produces a voltage across sensing resistor 274 which is detected and converted to a DC voltage at base 297 of transistor 295. Transistor 295 is normally nonconducting until the voltage at base 297 is sufficient to forward bias the transistor and cause it to conduct. The conduction level is selected by selecting the value of resistor 274 such that transistor 295 remains nonconducting until a predetermined overload current or short circuit current is imposed upon load 15 and triac 270. Once transistor 295 conducts, operating supply 231 is severely loaded which in turn resets integrated circuit 240 to its off position and terminates the output of triac trigger pulses at output 239. Thus, in the absence of successive trigger pulses, triac 270 ceases conducting following the completion of the current power cycle to protect load 15 and triac 270 from excessive current or short circuit conditions.

Diode 280, resistor 281, resistor 283 and capacitor 284 form a DC converter or rectifier which produces a DC voltage at base 287 of transistor 285 directly proportional to the AC voltage across triac 270. Because the voltage across triac 270 and load 15 vary inversely, transistor 285 is used to invert the DC voltage at base 287 and provide energizing of light emitting diode 289 which is inversely proportional to the AC voltage across triac 270 and directly proportional to the voltage across load 15. As a result, light emitting diode 289 is illuminated with an intensity which varies directly with the voltage across load 15 providing a visual power level indicator for the user.

Figure 5:
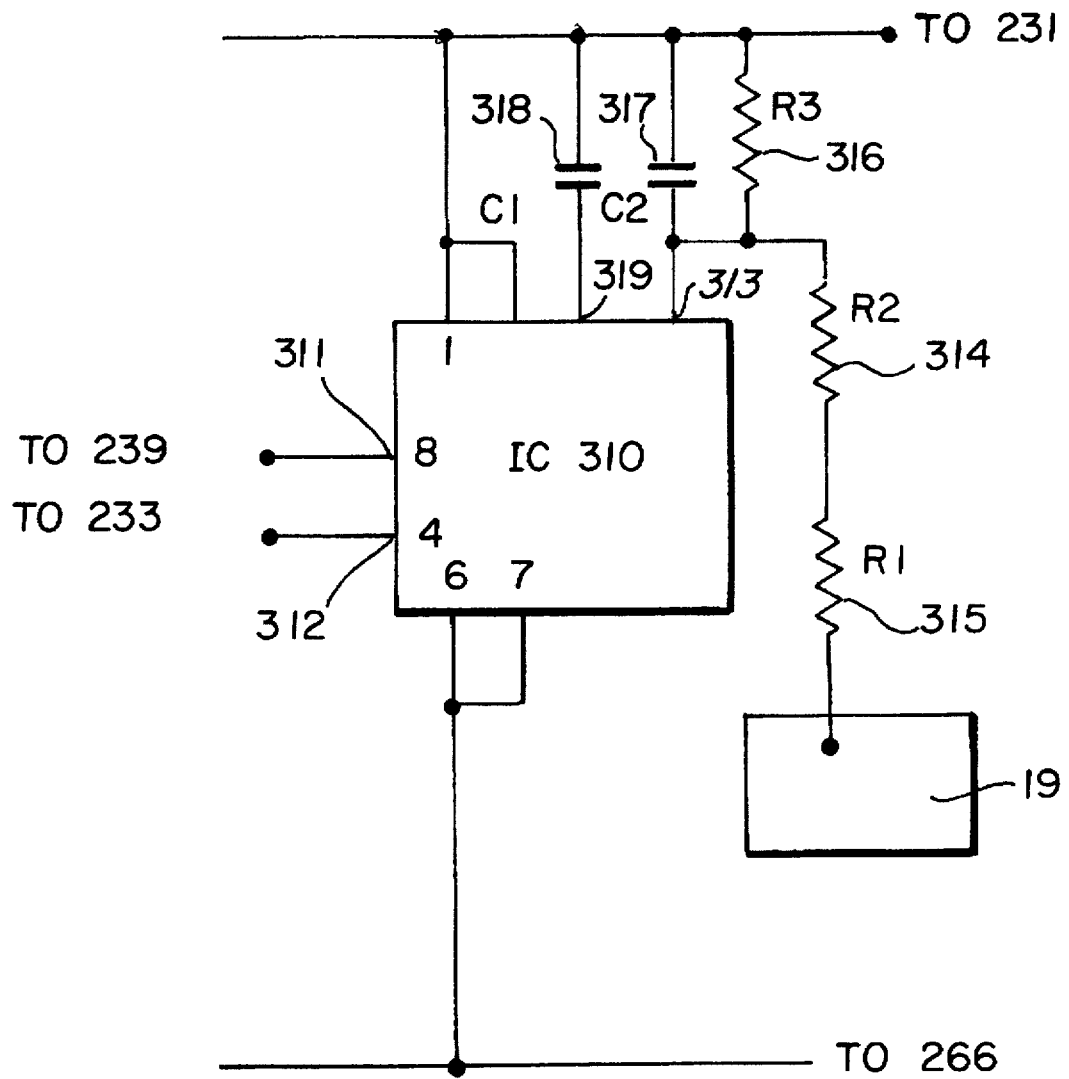
FIG. 5 sets forth a schematic diagram of a further alternate embodiment of the present invention touch responsive electric power controller.

FIG. 5 sets forth a still further alternate embodiment of the present invention employing an alternative integrated circuit in place of the LS7538 integrated circuit used for integrated circuit 240 in the embodiment of FIG. 4. Thus, the embodiment of FIG. 5 utilizes an integrated circuit reference by numeral 310 which comprises a device having the general device number LS7232. Integrated circuit 310 includes an AC input terminal 312 coupled to node 233 in FIG. 4 together with an output terminal 311 coupled to capacitor 246 in FIG. 4. Similarly, integrated circuit 310 includes an input 313 coupled to touch pad 19 by a series pair of resistors 314 and 315. Integrated circuit 310 further includes a parallel resistor and capacitor combination 316 and 317 further coupling terminal 313 to operating supply terminal 231 in FIG. 4. Finally, integrated circuit 310 includes a terminal 319 coupled to operating supply terminal 231 by a capacitor 318. When substituted in the manner described, integrated circuit 310 provides the same functions as provided in the embodiment of FIG. 4 by integrated circuit 240.

Figure 6:
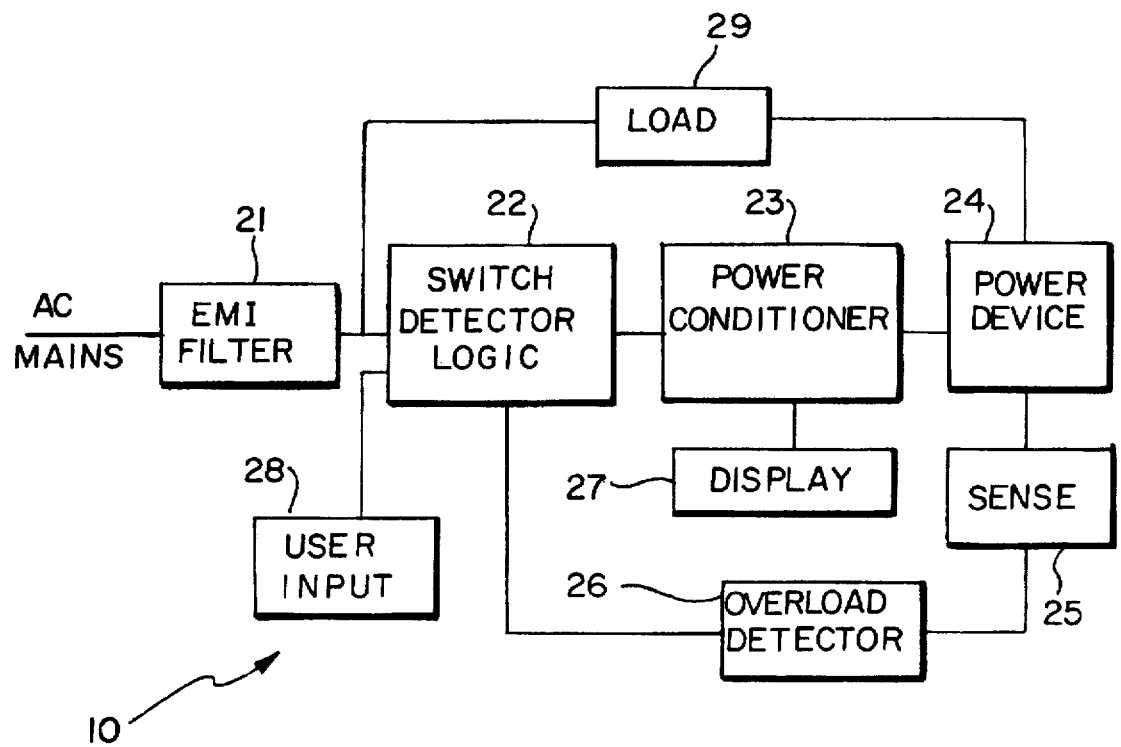
FIG. 6 sets forth a block diagram of an alternate embodiment of the present invention power controller.

FIG. 6 sets forth a block diagram of a still further alternate embodiment of the present invention electric power controller generally referenced by numeral 20. Power controller 20 includes an electromagnetic interference filter 21 coupled to a source of AC power (not Shown). Controller 20 further includes a switch logic 22 coupled to filter 21 and having an output coupled to a power conditioner 23. Power conditioner 23 includes an output coupled to a power control device 24 which in turn is coupled to a load 29. Load 29 is further coupled to the output of filter 21. A load current sensor 25 is coupled to power control device 24 and to an overload detector 26. Detector 26 is further coupled to switch detector logic 22. A user input 28 is coupled to switch detector logic 22 and a display 27 is coupled to power conditioner 23.

In operation, filter 21 includes conventional inductance and capacitance elements to filter out the interference created by the action of power device 24 during switching. Switch detector logic 22 is operative to sense the sequential operation of user input 28 and to store the sequence thereof. Switch detector logic 22 further operates to select different modes for controller 20 and to generate gradual or "soft start" signals to protect load 29 from abrupt power application. In addition, switch logic detector 22 includes circuitry responsive to an indicated short circuit or overload condition for disabling power device 24 and power conditioner 23. Power conditioner 23 synchronizes the operation of power device 24 with respect to the AC main power and generates the necessary firing signals for power device 24. For example, power device 24 may include a conventional triac having a trigger input which requires a firing signal to apply power to load 29. In such case, the phase relationship between the firing signal and the AC main power waveform determines the amount of voltage applied to load 29.

Current sensor 25 produces a signal proportional to the current carried by load 29 and power device 24 to which overload detector 26 responds. In the event overload detector 26 determines that an excessive load current is present indicating an overload or short circuit condition, overload detector 26 produces a signal applied to switch detector logic 22 causing switch detector logic 22 to respond and disable power device 24 by terminating the creation of trigger signals by power conditioner 23. Display 27 responds to signal supplied by power conditioner 23 to provide visual indication of the amount and duration of power applied to load 29. In its simplest form, display 27 may comprise a single light emitting diode. Alternatively, display 27 may include several light emitting diodes or color varying diodes. By way of further alternative, display 27 may include a numeric or alpha-type readout.

Figure 7:
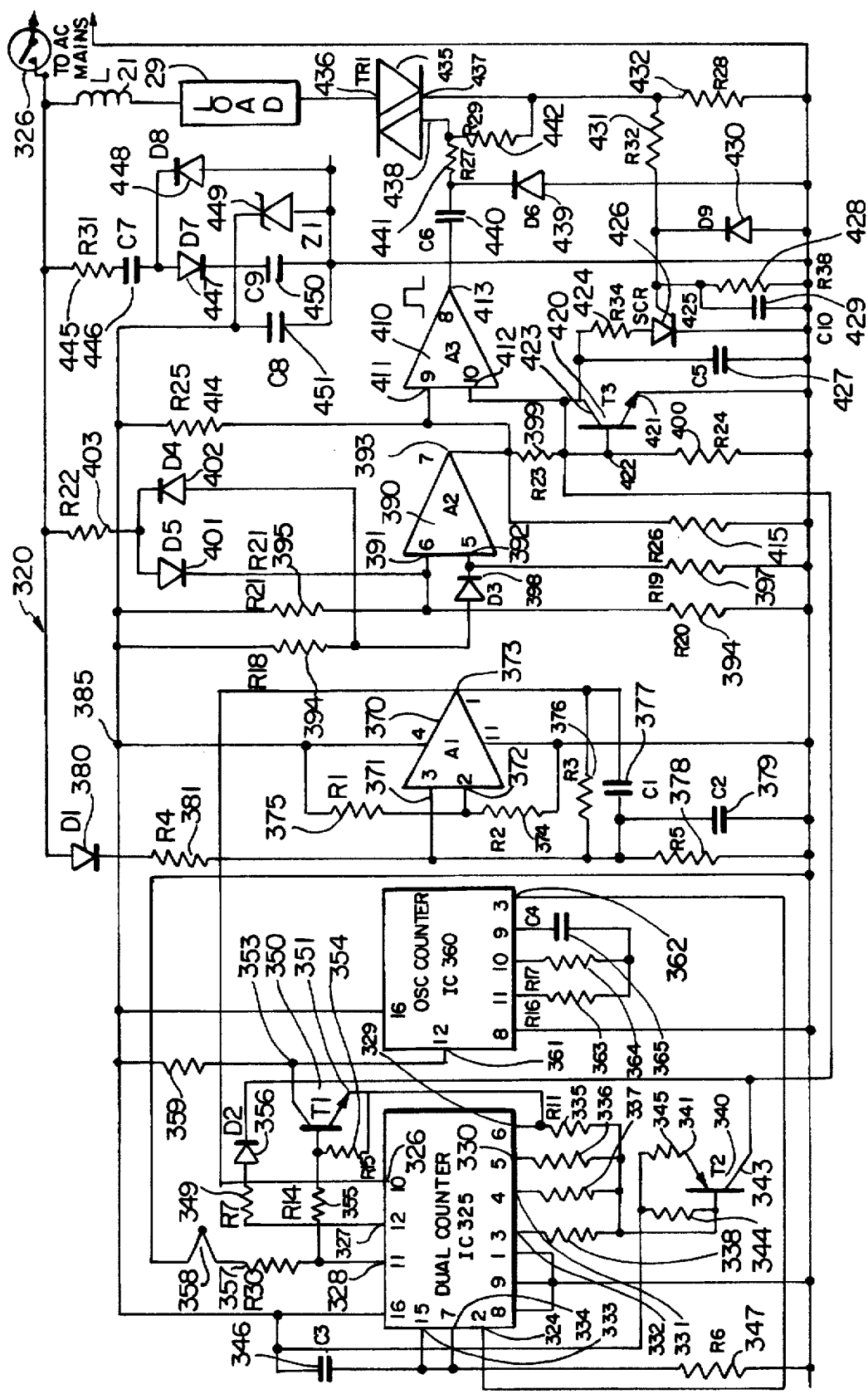
FIG. 7 sets forth a schematic diagram of a still further alternate embodiment of the present invention touch responsive electric power controller.

FIG. 7 sets forth a schematic diagram of a power controller constructed in accordance with the present invention and generally referenced by numeral 320. Power controller 320 is coupled to a source of AC main power (not shown) by a switch 321. It will be apparent to those skilled in the art that switch 321 may comprise any one of a variety of alternative switches such as a conventional mechanical on/off switch or a relay-type switch or a touch responsive switch. The important aspect of switch 321 is the ability to interrupt and connect controller 320 to the source of AC main power. Controller 320 includes an integrated circuit 325 which in the embodiment of FIG. 7 comprises an integrated circuit having a general device number CD4520 or its equivalent. Integrated circuit 325 is configured to provide a dual counter having reset input 333 and 334. The dual counter of integrated circuit 325 further includes a counting input 326, a pair of outputs 327 and 328, and a plurality of outputs 329 through 332. For purposes of convenience, the conventional pin numbers of the CD4520 device are also shown in FIG. 7. Outputs 329 through 332 are commonly coupled by a plurality of resistors 335 through 338 respectively to a base 342 of a PNP transistor 340. Transistor 340 includes an emitter 341 coupled to operating supply terminal 385 by a resistor 345 and a collector 343 coupled to a capacitor 427. Base 342 of transistor 340 is further coupled to operating supply terminal 385 by a resistor 344. A capacitor 346 couples operating supply terminal 385 to reset terminals 333 and 334 and a resistor 347 couples the reset terminals to ground. An NPN transistor 350 includes an emitter 351 coupled to output 329 of integrated circuit 325, a base 352 coupled to emitter 351 by a resistor 354 and to output 328 by a resistor 355. Output 328 is further coupled to ground by a resistor 357 and a light emitting diode 358. Collector 353 of transistor 350 is coupled to operating supply terminal 385 by a resistor 359. Output 327 is coupled to collector 343 of transistor 340 by the series combination of a resistor 349 and a diode 356.

Controller 320 further includes an integrated circuit 360 preferably comprising an integrated circuit having a standard device number CD4060 generally known as an oscillator and counter. Integrated circuit 360 includes a reset input 361 and an output 362. The frequency of oscillation of integrated circuit 360 is established by a pair of resistors 363 and 364 and a timing capacitor 365. For purposes of convenience, the conventional pin numbers are shown for integrated circuit 360 in FIG. 7. Output 362 of integrated circuit 360 is coupled to input 324 of integrated circuit 325. Reset input 361 is coupled to collector 353 of transistor 350.

An operational amplifier 370 includes a pair of inputs 371 and 372 and an output 373. Input 371 is coupled to switch 321 by a series combination of a resistor 381 and a diode 380. Input 371 is further coupled to ground by a resistor 378. In addition, a parallel resistance and capacitance combination 376 and 377 is coupled between output 373 and input 371. Input 372 is coupled to the junction of a voltage divider formed by resistors 375 and 374. Output 373 is coupled to counter input 326 of integrated circuit 325.

An operational amplifier 390 includes a pair of inputs 391 and 392 and an output 393. Input 391 is coupled to a voltage divider formed by a pair of resistors 394 and 395. Input 392 is coupled to ground by a resistor 397 and to the cathode of a diode 398. The anode of diode 398 is coupled to operating supply terminal 385 by a resistor 396. A pair of oppositely polled diodes 401 and 402 are commonly coupled to switch 321 by a resistor 403. The cathode of diode 401 is coupled to input 391 while the anode of diode 402 is coupled to the anode of diode 398. Output 393 is coupled to base 422 of transistor 420 by a resistor 399. Base 422 is further coupled to ground by a resistor 400. Transistor 420 is an NPN transistor having an emitter 421 coupled to ground and a collector 423 coupled to collector 343 of transistor 340. Collector 423 is further coupled to capacitor 427. A silicon controlled rectifier 425 has a cathode coupled to ground, an anode coupled to collector 423 by a resistor 424 and a gate electrode 426. A parallel resistance and capacitance combination 428 and 429 together with a diode 430 is coupled from gate electrode 426 to ground.

An operational amplifier 410 includes inputs 411 and 412 and an output 413. Input 411 is coupled to a voltage divider formed by resistors 414 and 415. Input 412 is coupled to collector 423 of transistor 420. Output 413 is coupled to a diode 439 by a capacitor 440.

A load 29 and filter 21 are serially coupled to switch 321 and terminal 436 of a triac 435. Terminal 437 of triac 435 is coupled to ground by a current sensing resistor 432. Triac 435 further includes a trigger electrode 438 coupled to electrode 437 by a resistor 442 and to diode 439 by a resistor 441.

A pair of power supply diodes 447 and 448 are oppositely coupled to switch 321 by a series capacitor 446 and a series resistor 445. The anode of diode 448 is coupled to ground while the cathode of diode 447 is coupled to a pair of parallel capacitors 450 and 451 each of which is further coupled to ground. A zener diode 449 is coupled in parallel with capacitors 450 and 451.

In operation, on/off switch 321 couples controller 320 to the conventional AC main power and may, for example, comprise a simple mechanical switch or, alternatively, utilize other apparatus such as a relay or touch control switching mechanism. The important aspect of switch 321 is the ability to interrupt and connect the controller AC mains input with respect to the AC main supply. Operational amplifier 370 provides detection of response to the operation of switch 321. Input 372 is maintained at a fixed reference voltage by the resistive divider formed by resistors 374 and 375. Input 371 is coupled to switch 321 by resistor 381 and diode 380. Thus, the AC main voltage is rectified by diode 380 and divided between resistors 381 and 378 and thus forms a DC voltage at input 371 when switch 321 is closed. Under normal operating conditions with switch 321 closed, the voltage developed at input 371 maintains output 373 of operational amplifier 370 at a high voltage state. If, however, switch 321 is momentarily moved to the open position and thereafter returned to the on position, the voltage applied to input 371 momentarily decreases and the output of operational amplifier 370 at output 373 switches to the low voltage condition. This low voltage condition is maintained until capacitor 377 discharges allowing output 373 to again switch to the high voltage state. As a result, operational amplifier 370 produces a negative going pulse having a pulse duration determined by the time constant of resistor 376 and capacitor 377 each time switch 321 is momentarily opened and closed. Thus, in effect, operational amplifier 370 provides a monostable pulse circuit responsive to the operation of switch 321.

The negative pulse produced by operational amplifier 370 in response to momentary operation of switch 321 is applied to input 326 of one of the counters of integrated circuit 325. The first counter within integrated circuit 325 counts the number of times a negative pulse is applied to input 326 which as mentioned corresponds to the number of times the user has operated switch 321. This number is maintained in the internal memory of integrated circuit 325.

When switch 321 is initially moved to the closed condition resulting in the initial "power on" of controller 320, the internal power supply of controller 320 described below in greater detail produces an operating supply voltage at supply terminal 385. During the initial power on, the response of capacitor 346 and resistor 347 to the operating supply produces reset input signals 333 and 334 of the dual counters within integrated circuit 325. As a result during power on, outputs 329 through 332 of one counter and outputs 327 and 328 of the other counter within integrated circuit 325 are set to zero. Once capacitor 346 charges, the reset signals applied to reset input 333 and 334 decrease and the counters within integrated circuit 325 enter their counting modes.

With output 328 at a low voltage or zero level, transistor T1 is nonconductive and a high voltage state is applied to output 361 of integrated circuit 360. This inhibits further counting and output 362 of integrated circuit 360 is maintained at a low voltage or zero signal level. In addition with outputs 329 through 332 maintained at a low voltage or zero level, PNP transistor 340 is fully conductive and begins charging capacitor 427. The charging of capacitor 427 produces an increasing ramp voltage which is applied to input 412 of operational amplifier 410. The remaining input 411 of operational amplifier 410 is coupled to a fixed reference voltage divider formed by resistors 414 and 415.

Operational amplifier 390 cooperates with operational amplifier 410 to synchronize and fire triac 435 to provide the desired applied voltage for load 29. In essence, operational amplifier 390 detects the zero crossing occurrences of the AC main power waveform to properly time the firing of triac 435. Operational amplifier 390 is normally biased at inputs 391 and 392 to maintain a high voltage output state at output 393. In addition, diodes 401 and 402 apply each half cycle of the AC main power waveform to inputs 391 and 392 which when present drive output 393 to a low voltage state. Thus, output 393 of operational amplifier 390 remains low during each half cycle of the applied AC power waveform and goes high during the zero crossing times of the AC power waveform when diodes 401 and 402 are turned off. The result is a positive going pulse produced at output 393 coincident with the zero crossing of the AC power waveform. This positive going pulse is applied to NPN transistor 420 causing it to conduct during the zero crossing interval and discharge capacitor 427. Thus, capacitor 427 is charged between zero crossing intervals by transistor 340 and rapidly discharged during zero crossing intervals by transistor 420. The result is a sawtooth waveform formed upon capacitor 427 which is applied to input 412 of operational amplifier 410. Operational amplifier 410 is biased by the voltage at input 411 to maintain a low voltage output state so long as input 412 remains below input 411. As the voltage upon capacitor 427 rises, input 412 is raised above input 411 and output 413 switches to the high voltage state providing a trigger signal which triggers triac 435. The relative timing or phase angle between the occurrence of the trigger pulse and the AC main waveform applied to triac 435 controls the amount of voltage applied to load 429. Thus, with outputs 329 through 332 at a zero voltage state, transistor 340 conducts maximally charging capacitor 427 rapidly which in turn produces an earlier firing pulse at output 413 of operational amplifier 410 resulting in a maximum voltage applied to load 29.

Thus, controller 320 is configured to initially operate load 28 at the maximum power condition as switch 321 is initially closed. In accordance with an important aspect of the present invention, controller 320 is preprogrammed to provide a timed operation of controller 320 and vary the voltage applied to load 29 in accordance with a preestablished power profile. Thus, following initial power on, the internal oscillator of integrated circuit 360 operates to produce clock signals having a frequency determined by resistors 363 and 364 and capacitor 365. The internal counter within integrated circuit 360 accumulates a count of oscillator clock signals and periodically produces an output signal at output 362 which is coupled to input 324 of the second counter within integrated circuit 325. The second counter within integrated circuit 325 accumulates the count of input signals at input 324 and configures outputs 329 through 332 in accordance with the accumulated count. Thus, with outputs 329 through 332 initially set to a zero or low voltage state, the successive input signals at input 324 produced by integrated circuit 360 cause outputs 329 through 332 to be switched to high voltage or 1 logic states as time continues. It should be recalled that with zero outputs at outputs 329 through 332, the voltage at base 342 of transistor 340 is at its lowest value which in turn produces maximum conduction of transistor 340 and the most rapid charging of capacitor 427. Once the input signals at input 324 cause outputs 329 through 332 to be reconfigured, however, the voltage at base 342 of transistor 340 is incrementally raised. With increased voltage at base 342, the conduction of transistor 340 is decreased and the charging rate of capacitor 427 becomes slower. The slower charging of capacitor 427 in turn delays the production of the triac firing pulse by operational amplifier 410 which in turn decreases the power applied to load 29. Thus, as time passes and the count within integrated circuit 325 accumulates, successive ones of outputs 329 through 332 are switched to high voltage or logic one states causing successive reductions in the conduction of transistor 340 and corresponding delays of firing triac 435 which in turn reduces the power applied to load 29. If, for example, load 29 is a plurality of incandescent lamps, a dimming action over time is produced. In accordance with the present invention, however, controller 320 may control other loads such as inductive or capacitive load appliances. In each case, the maximum power condition is determined by resistor 345 while the programmed power change profile is determined by the frequency of integrated circuit 360 and the resistances of resistors 335 through 338. As a result, controller 320 provides a substantial improvement in operation for purposes of economy and timed sequencing of power application to electrical loads such as lighting or appliances.

The programmed action of controller 320 can be interrupted by the user by simply cycling switch 321 returning controller 320 to the full power or maximum voltage application to load 29. In such case, light emitting diode 358 provides indication that controller 320 is in the timer mode.

Diode 447 and zener diode 449 provide a regulated power supply which produces the required operating voltage for controller 320 as applied to supply terminal 385. Capacitors 450 and 451 provide a filtering of this supply.

Controller 320 further provides a short circuit or overload protection by detecting the voltage developed across sensing resistor 432. Because the load current flows through load 29 and triac 435 and thereafter through resistor 432, the voltage across resistor 432 provides a reliable indicator of load current. This voltage is converted to a proportional DC voltage by diode 430 and capacitor 429 together with resistor 428. This DC voltage is applied to gate electrode 426 of a silicon controlled rectifier 425. Silicon controlled rectifier 425 is coupled in parallel with capacitor 427 through a resistor 424. In the event excess current such as occurring during an overload or short circuit of load 29 occurs, the DC voltage developed at gate 426 becomes sufficient to fire silicon controlled rectifier 425 discharging capacitor 427 and preventing its further charging. With capacitor 427 no longer charged, operational amplifier 420 ceases to produce trigger pulses for triac 435 and the application of power to load 29 is terminated.

Figure 8:
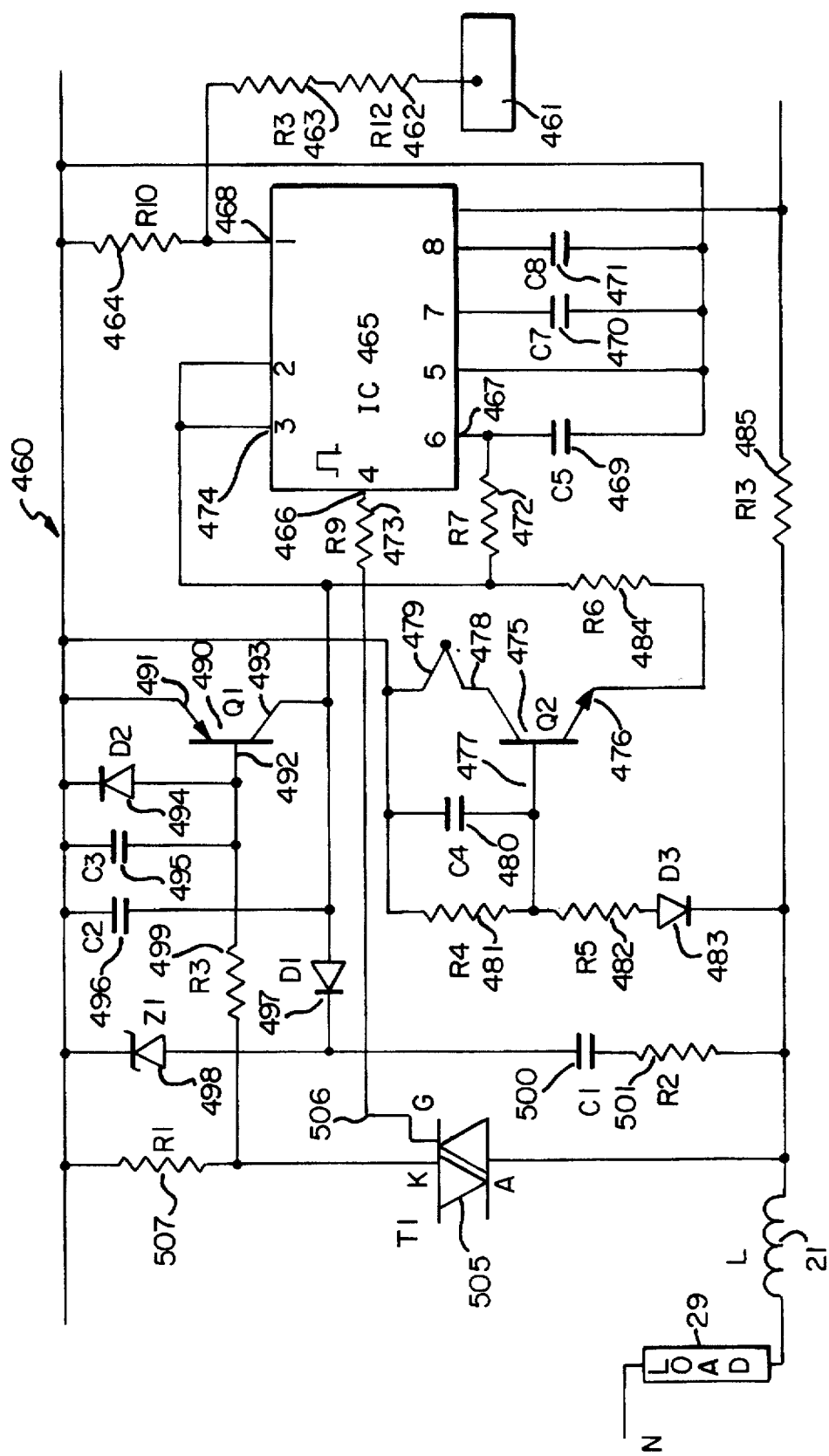
FIG. 8 sets forth a schematic diagram of a still further alternate embodiment of the present invention touch responsive electric power controller.

FIG. 8 sets forth a schematic diagram of a still further alternate embodiment of the present invention power controller generally referenced by numeral 460. Controller 460 is a touch timer utilizing a conventional integrated circuit 465 which in its preferred form comprises a standard device having device number LS7338 which is referred to in the art as a programmable timer integrated circuit manufactured by LSI Computer Systems, Inc. Integrated circuit 465 provides the standard functions of a touch controller including synchronization to the AC main power using capacitor 471 and resistor 485. Integrated circuit 465 produces a trigger signal at output 466 coupled by a resistor 473 to gate input 506 of triac 505. Triac 505 is coupled to load 29 and filter 21 as well as to a sensing resistor 507. Thus, integrated circuit 465 responds to manual touch upon touch pad 461 which is coupled to input 468 through resistors 462 and 463 to vary the timing of trigger pulse applied to triac 505 and thereby control the power applied to load 29. In addition, integrated circuit 465 includes an internal timer which provides a timed reduction of power applied to load 29 over a predetermined time interval. Capacitors 470 and 471 as well as resistor 464 are coupled to integrated circuit 465. Resistor 472 and capacitor 469 provide control of the time interval overwhich integrated circuit 465 begins reducing power to load 29.

In accordance with the present invention, controller 460 includes protection from overload or short circuit conditions upon load 29. The voltage across resistor 507 which is proportional to the current carried by load 29 and triac 505 is rectified by diode 494 and filtered by capacitor 495 and applied to base 492 of a PNP transistor 490. Transistor 490 has an emitter 491 coupled to one side of the AC main supply and a collector 493 coupled to the anode of diode 497 and to a capacitor 496. A zener diode 498 is coupled between the cathode of diode 497 and the AC main supply. A series combination of a capacitor 500 and a resistor 501 couples the cathode of diode 497 to filter 21. Thus, when excessive current flows through load 29 and triac 505, a correspondingly high voltage is developed across resistor 507 which is converted to a proportional DC voltage at base 492 causing transistor 490 to conduct and apply a reset signal to reset input 474 of integrated circuit 465. The reset of integrated circuit 465 terminates the output of triac trigger pulses at output 466 and terminates power to load 29.

Controller 460 further includes a power level indicator formed of an NPN transistor 475 having an emitter 476 coupled to reset input 474 by a resistor 484, a base 477 coupled to a pair of resistors 481 and 482 and a capacitor 480, and a collector 478 coupled to the AC main supply by a light emitting diode 479. The combination of capacitor 480, resistors 481 and 482, and diode 483 is coupled in parallel with triac 505 and produces a DC voltage at base 477 proportional to the voltage across triac 505. Transistor 475 inverts the voltage at base 477 and applies it to light emitting diode 479. Thus, under maximum load conditions, the voltage across triac 505 is minimum and a minimum illumination of light emitting diode 479 takes place. Conversely, under maximum power application to load 29, the voltage across triac 505 is minimum producing a minimum voltage at base 477 which is inverted by transistor 475 to provide a maximum illumination of light emitting diode 479.

Figure 9:
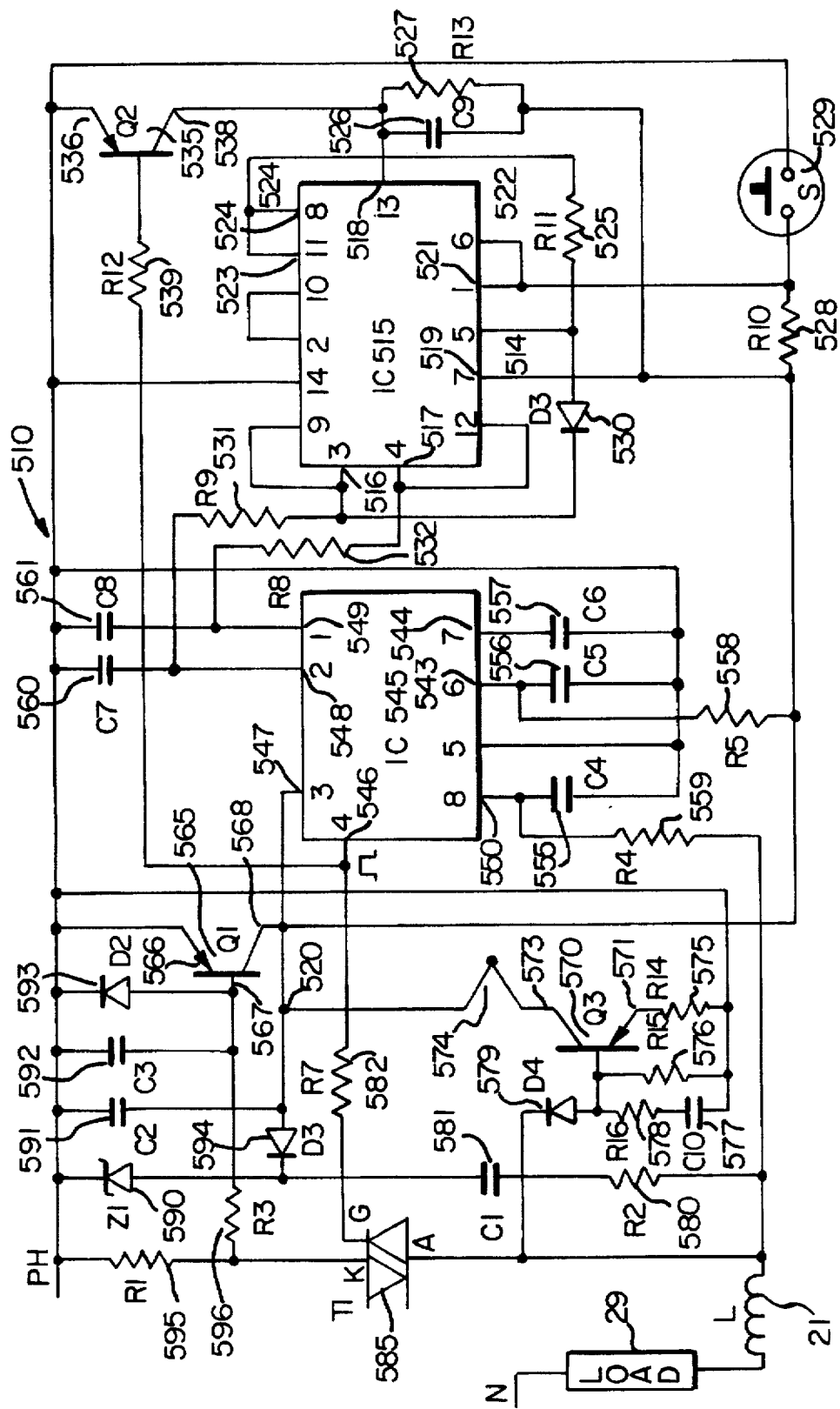
FIG. 9 sets forth a schematic diagram of a still further alternate embodiment of the present invention touch responsive electric power controller.

FIG. 9 sets forth a schematic diagram of a still further alternate embodiment of the present invention electric power controller generally referenced by numeral 510. Controller 510 includes an integrated circuit 515 which in its preferred form comprises a standard integrated circuit having device number CD4093 or its equivalent. For purposes of convenience, the standard integrated circuit pin numbers have been shown on integrated circuit 515. Controller 510 includes a PNP transistor 535 having an emitter 536 coupled to the main AC supply, a base 537, and a collector 538 coupled to input 518 of integrated circuit 515. A parallel resistor and capacitor 527 and 526 respectively is coupled between terminal 518 and operating supply voltage 520. A switch 529 couples the AC main power to operating supply terminal 520 by a resistor 528 and to input terminals 521 and 522 of integrated circuit 515. A resistor 525 couples terminals 523 and 524 of integrated circuit 515 to diode 530 and terminal 514 of integrated circuit 515. Diode 530 is in turn coupled to terminal 516 of integrated circuit 515.

Controller 510 further includes an integrated circuit 545 which in its preferred form comprises a standard device having a device number LS7339 manufactured by LSI Computer Systems, Inc. Integrated circuit 545 is generally referred to in the art as a programmable switch timer circuit and includes terminals 548 and 549 coupled to the AC main power by a pair of capacitors 560 and 561. A pair of resistors 531 and 532 couple outputs 516 and 517 of integrated circuit 515 to terminals 548 and 549 respectively. A trio of capacitors 555, 556 and 557 are commonly coupled between terminals 550, 543 and 544 respectively and to the AC main power. A resistor 558 couples terminal 543 to operating supply and a resistor 559 couples terminal 550 to a filter 21 which in turn is coupled to load 29.

A triac 585 is coupled to between filter 21 and the AC main power by a resistor 595. A PNP resistor 565 includes an emitter 566 coupled to the AC main power, a base 567 coupled to the parallel combination of a capacitor 592 and a diode 593. Base 567 is further coupled to the junction of resistor 595 and triac 585 by a resistor 569. Transistor 565 includes a collector 568 coupled to operating supply terminal 520. A capacitor 591 and a diode 594 are coupled to terminal 520. A zener diode 590 is coupled between the AC main and the cathode of diode 594. A series capacitor 581 and resistor 580 are coupled between the cathode of diode 594 and filter 21.

A PNP transistor 570 includes an emitter 571 coupled to the AC main by a resistor 575, a base 572 coupled to the AC main by a resistor 576 and the series combination of a resistor 578 and a capacitor 577, and a collector 573 coupled to operating supply terminal 520 by a light emitting diode 574. A diode 579 is coupled between base 572 and one side of triac 585.

In operation, integrated circuit 515 forms a quad 2 input nand schmitt trigger circuit. Integrated circuit 545 comprises a standard programmable switch timer integrated circuit which produces output triac trigger pulses at output terminal 546. Integrated circuit 545 provides conventional zero crossing timing using a sample of the AC main waveform coupled by resistor 559 and capacitor 555. Integrated circuit 515 provides the appropriate inputs to integrated circuit 545 in response to the actuation of switch 529 by the user.

Controller 510 includes an overload or short circuit protection utilizing transistor 565. Sensing resistor 595 develops a voltage proportional to the current within load 29 and triac 585 which is rectified by diode 593 and filtered by capacitor 592 for application to base 567. Once the voltage developed at base 567 exceeds a predetermined voltage indicative of excess current, transistor 565 conducts and discharges power supply filter capacitor 591 removing the operating supply voltage from integrated circuit 545. In response, integrated circuit 545 ceases the output of trigger pulses to triac 585 which in turn turns off the triac to protect it and load 29.

Controller 510 includes a power level indicator generally similar to that set forth in FIG. 8 with the primary change being the use of a PNP transistor 570 in place of an NPN transistor 475 used in the embodiment of FIG. 8. In other respects, however, the magnitude of voltage applied to load 29 is sensed by initially sensing the voltage across triac 585 and rectifying it using diode 579 and the combination of resistors 576 and 578 together with capacitor 577 to bias transistor 570. Because the voltage across triac 585 varies inversely with the load voltage, the inverted voltage at collector 573 of transistor 570 is used to drive LED 574.

What has been shown is a touch responsive electric power controller in several alternate embodiments which provide effective control of electric loads which may be resistive, inductive, or capacitive or combinations thereof. The controller shown provides short circuit or overload current protection together with a visual power level indicator for the convenience of the user. In the various embodiments shown, the present invention controller may be responsive to a manual touch control or, alternatively, various mechanical or electromechanical switching arrangements. In addition, the controller shown may be utilized as an aftermarket adapter switch, a built-in original equipment switch within the host appliance, or a module suitable for use in a conventional switch receptacle. The system shown provides a controller which is reversible between the AC mains and neutral and thus is operable in a number of wiring configurations.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. For use in controlling electrical power applied to a load from a power source producing a load current therein, a controller applying electrical power to loads which are resistive, capacitive or inductive, said controller comprising:

a touch logic circuit coupled to said power source and having a touch input;

a power conditioner coupled to said touch logic having a voltage level display and producing a power control signal responsive to said touch logic circuit;

a power device coupled to said power conditioner and said load, such that substantially all of said load current flows through said power device, varying the voltage applied to said load from said power source in response to said power control signal;

sensing means coupled to said power device for providing a signal indicative of the magnitude of said load current flowing through said power device;

overload means responsive to said signal from said sensing means for causing said power conditioner to apply a power control signal condition to said power device when said signal from said sensing means exceeds a predetermined level which terminates operation of said power device and the flow of said load current flowing therethrough; and touch means for altering said touch logic circuit in response to touch.

2. A controller as set forth in claim 1 wherein said power device includes a triac having a gate electrode and wherein said power conditioner includes:

zero crossing means for producing a line sync signal each time said main power sources crosses zero volts;

a saw wave forming capacitor for forming a saw wave signal;

charging means for charging said saw wave forming capacitor;

discharge means for discharging said saw wave forming capacitor in response to said line sync signal, said charging means and discharge means cooperating to form said saw wave signal upon said saw wave forming capacitor; and trigger means, responsive to said saw wave signal and coupled to said gate electrode, for producing a trigger pulse firing said triac each time said saw wave signal exceeds a predetermined amplitude.

3. A controller as set forth in claim 2 wherein said touch logic circuit includes means for changing the charging rate of said charging means each time said touch means is touched.

4. A controller as set forth in claim 3 wherein said sensing means includes a sensing resistor in series with said triac and wherein said overload means includes:

detecting means for converting the voltage developed across said sensing resistor to a proportional first DC voltage; and interrupt means disabling said trigger means when said first DC voltage exceeds a predetermined voltage.

5. A controller as set forth in claim 4 wherein said voltage level display includes:

a rectifier coupled to said triac and producing a second DC voltage proportional to the voltage across said triac;

an inverter for inverting said second DC voltage; and a light emitting diode coupled to said inverter producing a visual illumination inversely proportional to the voltage across said triac.

6. A controller as set forth in claim 5 wherein said touch means includes a touch pad and wherein said means for changing the charging rate of said charging means includes:

a monostable pulse generator, having an input coupled to said touch pad and an output, for producing a uniform output pulse each time said touch pad is touched;

a counter having an input coupled to said monostable pulse generator and a plurality of count outputs; and converting means coupled to said count outputs and applying a charging current to said wave forming capacitor responsive to said count outputs.

7. A controller as set forth in claim 6 wherein said converting means includes a plurality of diodes each having one electrode coupled to one of said count outputs and the remaining electrode commonly connected to said wave forming capacitor.

8. A controller as set forth in claim 6 wherein said monostable pulse generator includes:

an astable multivibrator coupled to said touch pad producing an oscillatory output signal having a reduced amplitude when said touch pad is touched;

an amplitude detector coupled to said multivibrator producing a voltage indicative of the amplitude of said oscillatory output signal; and an operational amplifier coupled to said amplitude detector producing an output pulse in response to said reduced amplitude of said oscillatory output signal.

9. For use in controlling AC electrical power applied to and load current within a load from an AC main, a controller comprising:

a triac coupling AC electrical power to said load and having a gate electrode for receiving a triac trigger signal, said triac conducting substantially all of said load current and ceasing to couple AC electrical power to said load in the absence of a triac trigger signal at said gate electrode;

a triac trigger circuit producing a triac trigger signal coupled to said trigger electrode having a phase relative to said AC main;

touch means coupled to said trigger circuit for varying the phase of said trigger signal in response to human touch; and overload means for sensing the magnitude of said load current carried by said triac and terminating the coupling of said triac trigger signal when sensed triac current exceeds a predetermined current to interrupt said load current.

10. A controller as set forth in claim 9 further including indicator means for providing a visual indication of the amount of AC electrical power applied to said load.

11. A controller as set forth in claim 10 wherein said triac trigger circuit further includes:

means for establishing the relative phase of said triac trigger signal to apply a first amount of AC electrical power to said load when said controller is initially turned on;

timer means for varying the AC electrical power applied to said load to at least one second different power amount after a predetermined time; and interrupt means for enabling said means for establishing and restoring said first amount of AC electrical power to said load.

12. A controller as set forth in claim 11 wherein said timer means includes a sequential stored program of a plurality of different power amounts.

13. A controller as set forth in claim 1 wherein said controller is fabricated on a single integrated circuit.

14. A controller as set forth in claim 1 wherein said load includes a fluorescent tube.

* * * * *